(12) United States Patent
Willems Van Dijk et al.

(10) Patent No.: US 7,397,539 B2
(45) Date of Patent: Jul. 8, 2008

(54) TRANSFER APPARATUS FOR TRANSFERRING AN OBJECT, LITHOGRAPHIC APPARATUS EMPLOYING SUCH A TRANSFER APPARATUS, AND METHOD OF USE THEREOF

(75) Inventors: Marcus Johannes Henricus Willems Van Dijk, Uden (NL); Pieter Renaat Maria Hennus, Peer (BE)

(73) Assignee: ASML Netherlands, B.V., Veldhoven (NL)

( * ) Notice: Subject to any disclaimer, the term of this patent is extended or adjusted under 35 U.S.C. 154(b) by 666 days.

(21) Appl. No.: 10/806,345

(22) Filed: Mar. 23, 2004

(65) Prior Publication Data

US 2004/0227924 A1 Nov. 18, 2004

(30) Foreign Application Priority Data

Mar. 31, 2003 (EP) .................................. 03075929

(51) Int. Cl.
*G03B 27/58* (2006.01)
*G03B 27/62* (2006.01)
*G03B 27/42* (2006.01)

(52) U.S. Cl. ............................. 355/72; 355/53; 355/75
(58) Field of Classification Search .................. 355/53, 355/72, 77, 75; 700/218; 360/71
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,537,311 A | 7/1996 | Stevens | |
| 5,790,338 A * | 8/1998 | Kanai et al. | .................... 360/71 |
| 5,969,441 A | 10/1999 | Loopstra et al. | |
| 6,242,879 B1 | 6/2001 | Sagues et al. | |
| 6,366,830 B2 | 4/2002 | Bacchi et al. | |
| 6,591,160 B2 * | 7/2003 | Hine et al. | ................... 700/218 |

(Continued)

FOREIGN PATENT DOCUMENTS

EP        1 052 546 A2      11/2000

(Continued)

OTHER PUBLICATIONS

European Search Report in reference to EP 03 07 5929 dated Oct. 16, 2003.

(Continued)

*Primary Examiner*—Peter B Kim
(74) *Attorney, Agent, or Firm*—Pillsbury Winthrop Shaw Pittman LLP

(57) ABSTRACT

The invention relates to a transfer apparatus for transferring an object. The transfer apparatus comprises a gripper for either gripping the object at a first position and then releasing the object at a second position proximate to a receiving structure or releasing the object at a first position after gripping the object at a second position proximate to the receiver structure. The transfer apparatus also includes a measurement device arranged to measure the relative position of the gripper with respect to the receiving structure in at least one dimension. Further, a relative position error is determined with respect to a desired relative position based on the relative position measured. The relative position of the gripper and receiving structure are adjusted in order to minimize the relative position error in the second position.

27 Claims, 3 Drawing Sheets

U.S. PATENT DOCUMENTS 6,856,863 B1 * 2/2005 Sundar .................. 700/254
2001/0020199 A1 9/2001 Bacchi et al.

FOREIGN PATENT DOCUMENTS

| WO | 98/33096 | 7/1998 |
|---|---|---|
| WO | 98/38597 | 9/1998 |
| WO | 98/40791 | 9/1998 |

OTHER PUBLICATIONS

Ultrasonic Sensor-Based Motion Control for Robotic Manipulators, Ganesh et al., Nov. 14, 1989, pp. 796-797.

* cited by examiner

TRANSFER APPARATUS FOR TRANSFERRING AN OBJECT, LITHOGRAPHIC APPARATUS EMPLOYING SUCH A TRANSFER APPARATUS, AND METHOD OF USE THEREOF

PRIORITY INFORMATION

This application claims priority from European Patent Application No. 03075929.4, filed Mar. 31, 2003, herein incorporated by reference in its entirety.

BACKGROUND OF THE INVENTION

1. Field of the Invention

The present invention relates to a transfer apparatus for transferring an object, a lithographic apparatus and an associated method of use.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523, 193, and PCT patent applications WO 98/38597 and WO 98/33096, which are incorporated herein by reference. In the case of a programmable mirror array, the said support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In order to produce increasingly smaller features, with increasingly finer patterns, the positioning of the substrate and the mask needs to be very accurate. So, during the transfer of an object, such as a substrate or a mask, from one position to another, accurate transfer and delivery positioning of the object needs to ensured. For example, substrates are usually transferred by a robot or manipulator, that picks up the substrate with a so called gripper. The robot comprises a robot drive and an armset, to which the gripper is attached, to handle and position the substrate. The transfer apparatus puts the substrate down on a receiver, e.g. pedestal or a chuck, comprising a substrate table.

The exact position of the object that is put down on the receiver, can be disturbed by several factors, such as: (a) vibrations of the robot drive, the armset and/or the gripper, (b) wear in the bearings of the robot, (c) limited accuracy of the robot, and (d) temperature expansion.

The velocity differences between the object and the receiver during takeover can also generate wear, and subsequently particles, that contaminate the system.

In order to increase the accuracy of positioning of a substrate relative to a receiver, a mechanical docking solution has been developed. Before the actual release of the substrate by a gripper at the receiver, a mechanical link is established between the gripper and the receiver. The mechanical link is provided on the gripper and docks into a docking interface provided on the receiver.

A compliant mechanism is also provided between the gripper and the armset, to decouple the movements of the gripper with respect to the armset. As a result of the mechanical link, the accuracy of the position of the gripper, and thus the substrate, with respect to the receiver is increased. Also, vibrations, and in particular the relative vibrations of the gripper and the receiver are reduced and the mutual accuracy of the substrate and the receiver can be increased. Of course, the mechanical docking solution can also be used for the reverse procedure, i.e. picking up objects, as for instance a substrate, from the receiver.

SUMMARY OF THE INVENTION

The mechanical docking solution disclosed above, suffers from a few drawbacks. For example, when the mechanical link of the gripper engages the docking interface, a relatively large deceleration can occur. In order to prevent the substrate from moving with respect to the gripper as a result of this deceleration, the gripper has to use relatively large clamping forces to hold the substrate in position. Such high clamping forces are difficult to generate and increase the cost of the system. In a vacuum environment, vacuum clamping not possible, so often other clamps are used, such as electrostatic clamps or clamps based on friction. However, these clamps are less strong than vacuum clamps and subsequently increase the risk of the substrate moving with respect to the gripper. The docking interface on the receiver needs to be stiff in order to be accurate. Therefore, the velocity of the gripper when approaching the receiver needs to be limited, in order to reduce the deceleration during docking and to prevent damage of the mechanical link and/or the docking interface. Lower velocities decrease the throughput of the system. Damage and wear, due to mechanical contact between the mechanical link and the docking interface, could generate particles that contaminate the system.

For these and other reasons, the principles of the present invention, as embodied and broadly described herein, provide for a transfer apparatus that includes an accurate takeover of an object by a receiver, with a relatively high velocity, while reducing release of contaminating particles. In one embodiment, the transfer apparatus comprises a gripper for at least one of gripping the object at a first position and releasing the object at a second position proximate to a receiver and releasing the object at a first position after gripping the object at a second position proximate to the receiver.

In one embodiment, the transfer apparatus is further provided with a measurement device arranged to measure the relative position of the gripper with respect to the receiver in at least one dimension in which a relative position error is defined with respect to a desired relative position based on the relative position measured, and the relative position of the gripper and the receiver is adjusted for minimizing the relative position error in the second position.

Such a transfer apparatus enables accurate positioning between the gripper, comprising the object that is transferred, and the receiver. Since no mechanical contact between the gripper and receiver is required, no contamination particles may be produced as a result of such contact and neither may contamination particles be released as a result of mechanical impact, while relatively high transfer velocities may be achieved.

According to an embodiment of the invention, the object is a substrate, such as a mask or a wafer, and the receiver is a substrate table, such as a mask table or a wafer table. In the lithographic industry there is a great demand for accurate transfer apparatus. The transfer apparatus according to the invention can be advantageously used in that industry.

According to an embodiment of the invention, the relative position of the gripper and the receiver is measured by measuring the relative position between a first reference point of the receiver and a second reference point of the gripper. Using reference points enables the sensor to accurately determine relative position.

According to an embodiment of the invention, the measurement device comprises at least one sensor provided on the receiver and a first reference point is provided on the sensor, and a second reference point is provided on the gripper or an object on the gripper; or the measurement device comprises at least one sensor provided on the gripper, and a first reference point is provided on the sensor, and a second reference point is provided on the receiver. Using a sensor is an easy and cost-effective way of determining a relative distance. Many kinds of sensors can be used, for instance, a Hall sensor, an interferometer or a laser sensor. The sensor can either be positioned on the gripper and/or the receiver.

According to an embodiment of the invention, the measurement device comprises at least one sensor provided on a frame, that is relatively stable with respect to the gripper and the receiver, and a first reference point is provided on the gripper or an object on the gripper and a second reference point is provided on the receiver. When the measurement device needs to be incorporated into an existing machine, it could be difficult to position the sensor on the gripper or the receiver. A frame could be the solution.

According to an embodiment of the invention, the transfer apparatus comprises mechanical docking means for mechanically docking the gripper to a frame, the measurement device comprises at least one sensor provided on a frame, that is relatively stable with respect to the gripper and the receiver, and a reference point is provided on the receiver. Docking the gripper in a mechanical way can be advantageously, when the gripper arrives before the receiver arrives. Since the gripper needs to wait for the receiver to arrive, the mechanical docking can be done with low velocities, taking away the disadvantages of the mechanical docking described above. The throughput of the system is not influenced by this, since the arrival of the receiver is the limiting factor.

According to an embodiment of the invention, the difference in relative velocity between the gripper and the receiver at the second position, is minimized. Minimizing the velocity difference between the gripper and the object helps ensure an accurate and smooth takeover.

According to an embodiment of the invention, the difference in relative acceleration between the gripper and the receiver at the second position, is minimized. Minimizing the acceleration difference between the gripper and the receiver helps ensure an even more accurate and smooth takeover.

According to an embodiment of the invention, the measuring device is adapted to measure the relative position in at least two directions. Measuring the relative position in at least two directions helps ensure an accurate and smooth takeover.

According to an embodiment of the invention, the relative position error is also determined using information about the relative position of the object with respect to the gripper. The object could be handed to the gripper by a pre-aligner. Such a pre-aligner could provide information about the position of the object with respect to the gripper. This information can be used to determine the desired relative position of the gripper with respect to the receiver, in order to establish a correct relative position of the object with respect to the receiver.

According to a further aspect, the invention relates to a lithographic projection apparatus comprising a radiation system for providing a projection beam of radiation, a support structure for supporting patterning device, the patterning device serving to pattern the projection beam according to a desired pattern, a substrate table for holding a substrate, and a projection system for projecting the patterned beam onto a target portion of the substrate, wherein the lithographic projection apparatus further comprises a transfer apparatus according to the invention.

According to a further aspect, the present invention relates to a method of transferring an object, in a transfer apparatus by means of a gripper, comprising at least one of gripping the object at a first position and releasing the object at a second position proximate to a receiver and releasing the object at a first position after gripping the object at a second position proximate to the receiver characterized by measuring the relative position of the gripper with respect to the receiver in at least one dimension, a relative position error being defined with respect to a desired relative position based on the relative position measured, and adjusting relative position of the gripper and the receiver for minimizing the relative position error in the second position.

According to a further aspect, the present invention relates to a device manufacturing method comprising providing a substrate that is at least partially covered by a layer of radiation-sensitive material to a desired position, providing a projection beam of radiation using a radiation system, using patterning device to endow the projection beam with a pattern in its cross section, and projecting the patterned beam of radiation onto a target portion of the layer of radiation-sensitive material, characterized by using the method of transferring an object according to the present invention to transfer the substrate to said desired position.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
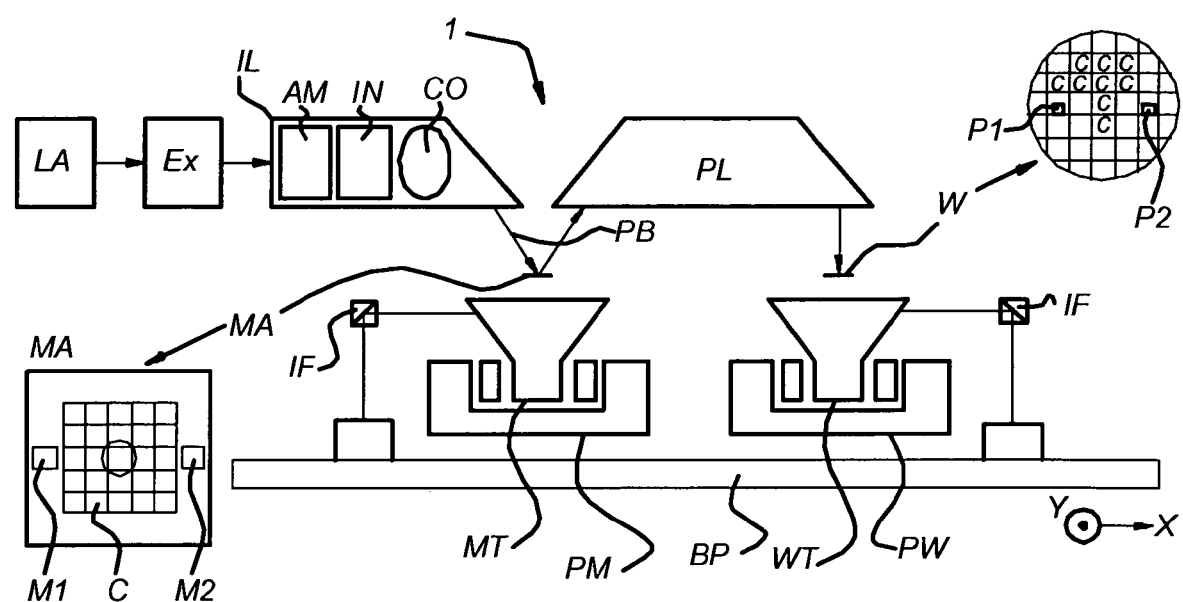
FIG. 1 depicts a lithographic projection apparatus according to an embodiment of the invention.

FIG. 1 schematically depicts a lithographic apparatus according to a particular embodiment of the invention. The apparatus comprises:

a radiation system Ex, IL: for supplying a projection beam PB of radiation (e.g. UV radiation). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL; and a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

Figure 2:
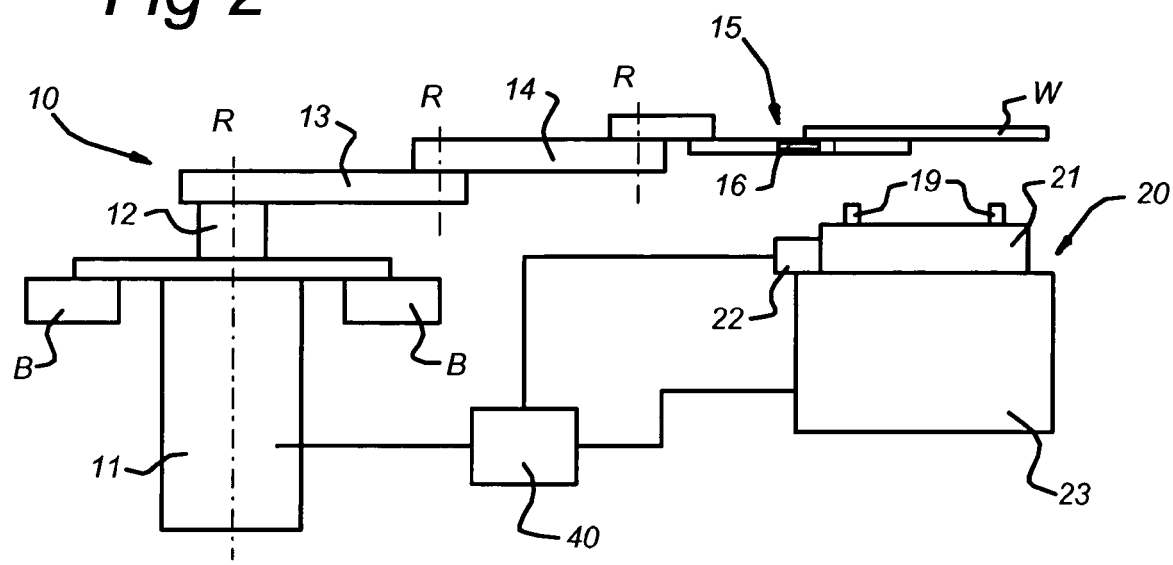
FIG. 2 depicts a transfer apparatus according to a first embodiment of the present invention.

FIG. 2 shows a transfer apparatus, comprising a robot 10, according to a first embodiment of the present invention. The robot 10 can be a SCARA-robot, but also other manipulators known to a person skilled in the art can be used. The robot 10 is attached to a base B or the ground using a support 11. On top of the support 11, a robot drive 12 is provided, that controls an armset, comprising a first and a second arm 13, 14. Of course, the armset 13, 14 can be provided with any suitable number of arms. The robot drive 12 and the first arm 13 are rotatably attached to each other. The first arm 13 and the second arm 14 are rotatably attached to each other. The robot drive 12 can independently rotate the arms 13, 14 around the dotted lines R, as indicated in FIG. 2.

At the far end of the second arm 14, a gripper 15 is rotatably attached. The gripper 15 is also arranged to rotate around a rotational axis R, as indicated in FIG. 2. The robot 10 can position the gripper 15 in any desired position within a circle around the support 11, having a radius that is substantially determined by the length of the arms 13, 14. As is apparent, also other kinds of robots may be used.

The gripper 15 is arranged to clamp an object, such as a substrate used in a lithographic projection apparatus. In the embodiment depicted in FIG. 2 the gripper 15 is arranged to clamp a wafer W, but the gripper 15 can of course also be used to clamp, for example, a mask MA. Clamping can be done in several ways, as already discussed above, for instance, the gripper 15 can use a low pressure clamp to suck the wafer W to the gripper 15. Alternative embodiments could use a clamp based on friction or a can use electromagnetic forces to clamp the wafer W.

The transfer apparatus 10 may move the substrate to a desired position, to hand it over to a receiver 20. The receiver 20 can be a wafer stage/holder 20 or a mask stage/holder but may also be any device, movable or not, in receipt of an object and that is capable of receiving a released object or giving up an object for gripping. This embodiment will be discussed with reference to a wafer stage, comprising a wafer chuck 23 and a wafer table 21 positioned on the wafer chuck 23. The position of the receiver 20 can accurately be monitored using, e.g. an interferometer IF, as shown in FIG. 1, that cooperates with a mirror on the wafer chuck 23. The position of the receiver 20 can be adjusted using known techniques.

In the example shown in FIG. 2, the wafer W is handed over to a wafer stage 20. When the wafer W is in the desired position with respect to the wafer stage 20, the gripper releases the wafer W. The receiver 20 comprises a support device 19 for supporting a received wafer W. In the embodiments shown, the receiver 20 comprises e-pins to support the wafer W, as is known to a person skilled in the art.

In order to determine the relative position of the gripper 15 with respect to the wafer stage 20, a sensor system is provided that measures the relative position of the gripper 15 with respect to the wafer stage 20, by determining the relative position of a first and a second reference point.

This can be done, for instance, with a sensor 22 positioned on the wafer stage 20, that facilitates measurement of the relative position of a first reference point, provided on the sensor 22, and a second reference point 16, provided on the gripper 15. The sensor system could be arranged to determine the relative position in only one dimension or in several degrees of freedom. Also more than one sensor could be provided, as will be understood by a person skilled in the art.

It will be understood that most sensors have a limited sensing area, so the second reference point 16 will first have to be brought in to the sensing area of the sensor. The sensor system can further be arranged to measure the relative velocity and/or acceleration of the gripper 15 with respect to the wafer stage 20. Of course, it will be understood that the sensor 22 with the first reference point can be positioned on the gripper 15 and the second reference point 16 can be positioned on the wafer stage 20.

Advantageously, the sensor 22 facilitates determination of the relative position of the gripper 15 and the wafer stage 20 without requiring those items to be fixed with respect to each other mechanically. This can for instance be done using a capacitive or inductive sensor 22, where the reference points are formed by electromagnets. It is also possible to use an interferometer or an encoder. Such sensors 22 are known to a person skilled in the art.

In most cases the relative position of the wafer W with respect to the gripper 15 will be known, since the gripper 15 picks up the wafer W in a pre-aligner. This pre-aligner accurately hands over the wafer W to the gripper 15 and measures the exact position of the wafer W with respect to the gripper 15. However, when the relative position of the wafer W is not known with respect to the gripper 15, it could be advantageous to provided the second reference point 16 on the wafer W instead of on the gripper 15.

The measured relative position of the gripper 15 and the wafer stage 20 is compared with a desired relative position. This desired relative position between the gripper 15 and the wafer stage 20 can have a standard value, including zero, but could also be based on information of the relative position of the wafer W with respect to the gripper 15, for instance provided by a pre-aligner, that handed over the wafer W to the gripper 15. The relative position error can then be determined by finding the difference between the desired and the measured relative position. The relative position error can be minimized by adjusting the relative position of the gripper 15 with respect to the wafer stage 20, using, for instance, a closed-loop circuit. It is, for instance, possible to adjust the position of the gripper 15 or to adjust the position of the wafer stage 20. It is also possible to adjust positions of the wafer stage 20 as well as the gripper 15.

In order to make these adjustments, a control device 40 is provided to communicate with the sensor 22, the robot drive 12 and the wafer stage 20. The wafer stage 20 is usually provided with actuators, that are arranged to adjust the position of the wafer stage 20. Such a control device 40 can, for instance, be a computer device, comprising a processing unit and a memory unit as is known to a person skilled in the art.

Since the relative position of the gripper 15 with respect to the wafer stage 20 is constantly monitored and adjusted, the relative position will be almost fixed, enabling an accurate and smooth takeover of the wafer W by the wafer stage 20 from the gripper 15, or vice versa, i.e. an accurate and smooth gripping of the wafer W from the wafer stage by the gripper 15.

Figure 3:
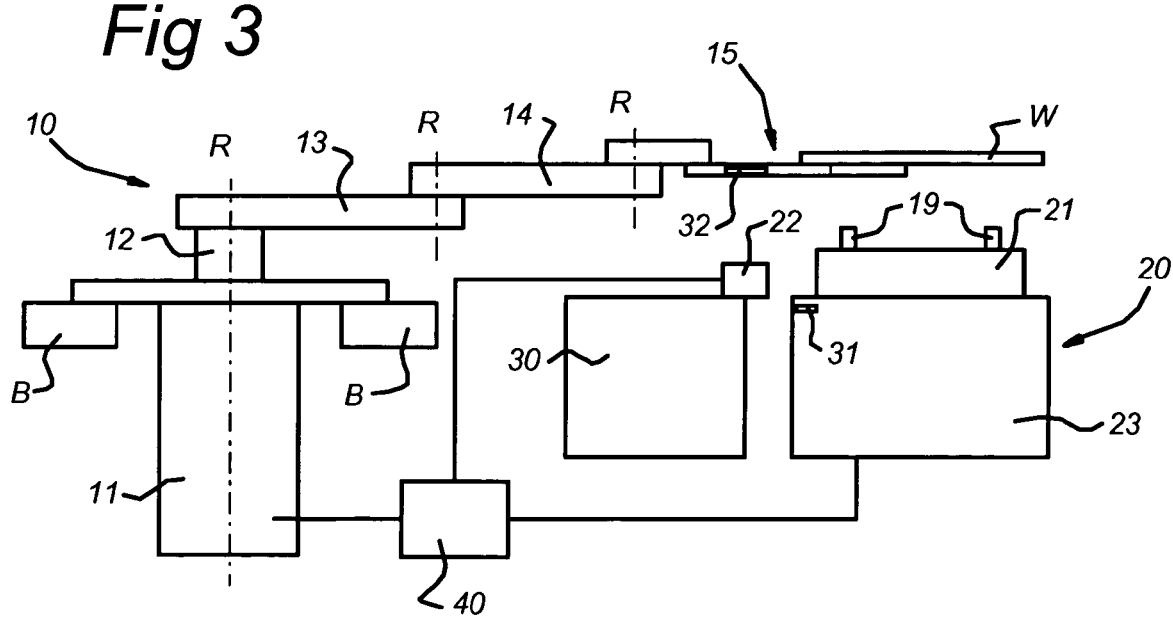
FIG. 3 depicts a transfer apparatus according to a second embodiment of the present invention.

A further embodiment of the invention is shown in FIG. 3, where the sensor 22 is provided on a frame 30, that is independent of the gripper 15 and the wafer stage 20. Preferably, the frame 30 is relatively still with respect to the gripper 15 and the wafer stage 20, for instance, connected to a base or the ground.

The relative position of the gripper 15 and the wafer stage 20 is then determined using the sensor 22 by measuring the relative position of a first reference point 31, provided on the wafer stage 20, and a second reference point 32 provided on the gripper 15.

Figure 4:
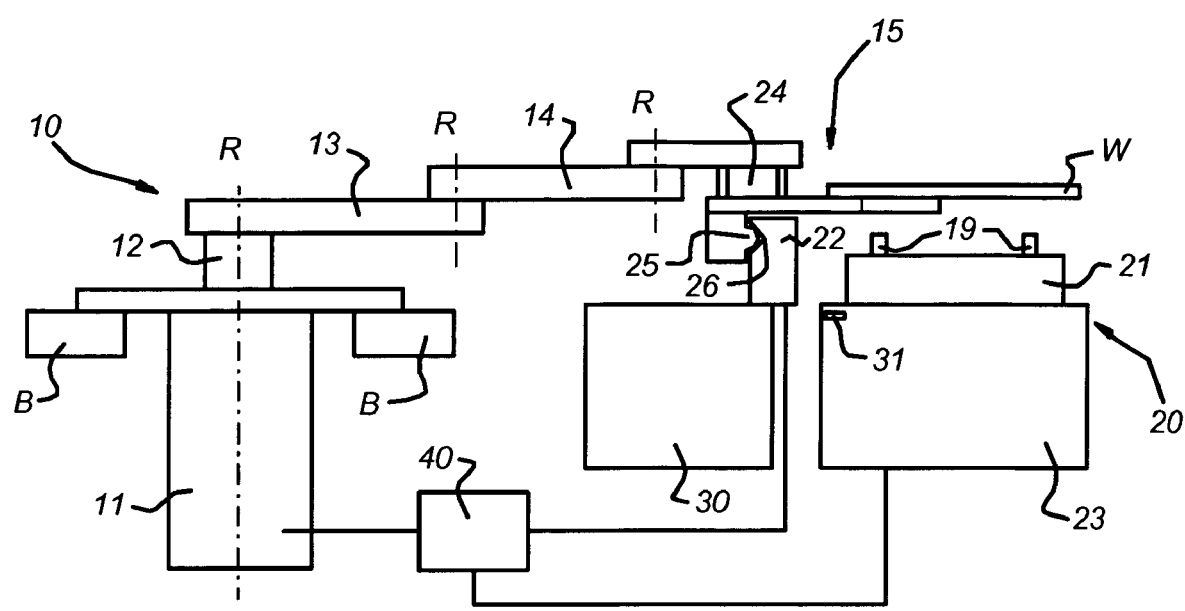
FIG. 4 depicts a transfer apparatus according to a third embodiment of the present invention.

In practice, the gripper 15 holding the wafer W typically arrives at a position for release of the wafer W before the wafer stage 20 arrives at a position for receipt of the wafer W. Similarly, the gripper 15 picking up a wafer W from the wafer stage 20 may arrive at a position for gripping the wafer W before the wafer stage 20 arrives at the position for releasing the wafer W. In that case it could be preferred to use a mechanical docking system for docking the gripper 15 to the frame 30, as is depicted in FIG. 4. Since the gripper 15 will have to wait for the receiver 20 to arrive, this mechanical docking can be done a relatively low speeds, taking away much of the drawbacks of mechanical docking as described above. Also, possible wear particles generated by the mechanical docking will be less harmful, since these particles are not created close to the wafer stage 20.

The gripper 15 is now mechanically coupled to the frame, of which the position is relatively still and determined. Coupling can be done, for example, by means of a mechanical link 25, formed as a part of the gripper. The mechanical link 25 is arranged to be engaged by a docking interface 26. The unwanted disturbances coming from armset 13, 14 are minimized by applying a compliant mechanism 24 already mentioned above. As a consequence of the compliant mechanism 24, the relative position error can not be minimized by adjusting the position of the gripper 15, but will only be possible by adjusting the position of the wafer stage 20. The wafer stage 20 can be moved until there is no or little relative position error and the wafer W can be released to the wafer stage 20 or the wafer is picked up by the gripper 15.

The sensor 22 can determine the relative position of the wafer stage 20 by determining the relative position of a reference point 31 provided on the wafer stage 20, in a similar way as already described above.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A transfer apparatus for transferring an object, comprising:

a gripper for at least one of (a) gripping the object at a first position and releasing said object at a second position proximate to a receiver and (b) releasing said object at a first position after gripping said object at a second position proximate to said receiver;

a measurement device, separate and displaced from said gripper, configured to measure a relative position of said gripper with respect to said receiver in at least one direction, wherein a relative position error is determined with respect to a desired relative position of said gripper with respect to said receiver, the determination based on the measured relative position of said gripper with respect to said receiver, and the relative position of the gripper with respect to said receiver is adjusted based on the reduction of the relative position error at the second position and a difference in relative velocity or acceleration between said gripper and said receiver is minimized.

2. The transfer apparatus of claim 1, wherein said object comprises a substrate and said receiver comprises a substrate holder.

3. The transfer apparatus of claim 1, wherein said object comprises a mask and said receiver comprises a mask support structure.

4. The transfer apparatus of claim 1, wherein the relative position of said gripper with respect to said receiver is measured by measuring the relative position between a first reference point of said receiver and a second reference point of said gripper.

5. The transfer apparatus of claim 1, wherein said measurement device comprises at least one sensor provided on said receiver and a first reference point is provided on said sensor and a second reference point is provided on said gripper or said object on said gripper.

6. The transfer apparatus of claim 1, further comprising at least one sensor is-provided on said gripper and wherein a first reference point is provided on said sensor and a second reference point is provided on said receiver.

7. The transfer apparatus of claim 1, wherein said measurement device comprises at least one sensor provided on a frame that is relatively stable with respect to said gripper and said receiver, and a first reference point is provided on said gripper or said object on said gripper and a second reference point is provided on said receiver.

8. The transfer apparatus of claim 1, wherein said transfer apparatus comprises a mechanical docking structure configured to dock said gripper to a frame and said measurement device comprises at least one sensor provided on said frame that is relatively stable with respect to said gripper and said receiver, and a reference point is provided on said receiver.

9. The transfer apparatus of claim 1, wherein said measurement device is adapted to measure the relative position in at least two directions.

10. The transfer apparatus of claim 1, wherein the relative position error is additionally determined by using information regarding the relative position of said object relative to said gripper.

11. A lithographic apparatus, comprising:
a support structure configured to support a patterning device that imparts a beam of radiation with a desired pattern;
a substrate holder configured to hold a substrate;
a projection system configured to project said patterned beam of radiation onto a target portion of said substrate; and
a transfer apparatus for transferring said patterning device, wherein said transfer apparatus comprises:
a gripper for at least one of (a) gripping said patterning device at a first position and releasing said patterning device at a second position proximate to said support structure and (b) releasing said patterning device at a first position after gripping said patterning device at a second position proximate to said support structure, and
a measurement device, separate and displaced from said gripper, configured to measure a relative position of said gripper with respect to said support structure in at least one direction,
wherein a relative position error is determined with respect to a desired relative position of said gripper with respect to said receiver, the determination based on the measured relative position of said gripper with respect to said receiver, and the relative position of the gripper with respect to said receiver is adjusted based on the reduction of the relative position error at the second position and a difference in relative velocity or acceleration between said gripper and said receiver is minimized.

12. The lithographic apparatus of claim 11, wherein the relative position of said gripper with respect to said support structure is measured by measuring the relative position between a first reference point of said support structure and a second reference point of said gripper.

13. The lithographic apparatus of claim 11, further comprising at least one sensor provided on said support structure and wherein a first reference point is provided on said sensor and a second reference point is provided on said gripper or said patterning device on said gripper.

14. The lithographic apparatus of claim 11, wherein said measurement device comprises at least one sensor provided on said gripper and a first reference point is provided on said sensor and a second reference point is provided on said support structure.

15. The lithographic apparatus of claim 11, wherein said measurement device comprises at least one sensor provided on a frame that is relatively stable with respect to said gripper and said support structure, and a first reference point is provided on said gripper or said patterning device on said gripper and a second reference point is provided on said support structure.

16. The lithographic apparatus of claim 11, wherein said transfer apparatus comprises a mechanical docking structure configured to dock said gripper to a frame and said measurement device comprises at least one sensor provided on said frame that is relatively stable with respect to said gripper and said support structure, and a reference point is provided on said support structure.

17. The lithographic apparatus of claim 11, wherein said measurement device is adapted to measure the relative position in at least two directions.

18. A lithographic apparatus, comprising:
a support structure configured to support a patterning device that imparts a beam of radiation with a desired pattern;
a substrate holder configured to hold a substrate;
a projection system configured to project said patterned beam of radiation onto a target portion of said substrate; and
a transfer apparatus for transferring said substrate, wherein said transfer apparatus comprises:
a gripper for at least one of (a) gripping said substrate at a first position and releasing said substrate at a second position proximate to said substrate holder and (b) releasing said substrate at a first position after gripping said substrate at a second position proximate to said substrate holder, and
a measurement device, separate and displaced from said gripper, configured to measure a relative position of said gripper with respect to said substrate holder in at least one direction,
wherein a relative position error is determined with respect to a desired relative position of said gripper with respect to said receiver, the determination based on the measured relative position of said gripper with respect to said receiver, and the relative position of the gripper with respect to said receiver is adjusted based on the reduction of the relative position error at the second position and a difference in relative velocity or acceleration between said gripper and said receiver is minimized.

19. The lithographic apparatus of claim 18, wherein the relative position of said gripper with respect to said substrate holder is measured by measuring the relative position between a first reference point of said substrate holder and a second reference point of said gripper.

20. The lithographic apparatus of claim 18, further comprising at least one sensor provided on said substrate holder and wherein a first reference point is provided on said sensor and a second reference point is provided on said gripper or said substrate on said gripper.

21. The lithographic apparatus of claim 18, wherein said measurement device comprises at least one sensor provided on said gripper and a first reference point is provided on said sensor and a second reference point is provided on said substrate holder.

22. The lithographic apparatus of claim 18, wherein said measurement device comprises at least one sensor provided on a frame that is relatively stable with respect to said gripper and said substrate holder, and a first reference point is provided on said gripper or said substrate on said gripper and a second reference point is provided on said substrate holder.

23. The lithographic apparatus of claim 18, wherein said transfer apparatus comprises a mechanical docking structure configured to dock said gripper to a frame and said measurement device comprises at least one sensor provided on said frame that is relatively stable with respect to said gripper and said substrate holder, and a reference point is provided on said substrate holder.

24. The lithographic apparatus of claim 18, wherein said measurement device is adapted to measure the relative position in at least two directions.

25. A method of transferring an object via a gripping device, said method comprising:
  gripping with said gripping device at least one of (a) said object at a first position and releasing said object at a second position proximate to a receiving structure and (b) releasing said object at a first position after gripping said object at a second position proximate to said receiving structure,
  measuring a relative position of said gripping device with respect to said receiving structure in at least one direction using a measurement device separate and displaced from said gripping device,
  determining a relative position error with respect to a desired relative position based on the measured relative position, and
  adjusting relative position of said gripping device with respect to said receiving structure to minimize the relative position error and the difference in relative velocity or acceleration between said gripper and said receiver, at the second position.

26. A device manufacturing method, comprising:
  providing a beam of radiation using a radiation system;
  imparting a desired pattern onto said beam of radiation by a patterning device;
  providing a substrate that is held by a substrate holder;
  transferring said substrate via a gripping device, said transferring including:
    gripping with said gripping device at least one of (a) said substrate at a first position and releasing said substrate at a second position proximate to the substrate holder and (b) releasing said substrate at a first position after gripping said substrate at a second position proximate to the substrate holder,
    measuring a relative position of said gripping device with respect to said substrate holder in at least one direction using a measurement device separate and displaced from said gripping device,
    determining a relative position error with respect to a desired relative position based on the measured relative position, and
    adjusting relative position of said gripping device with respect to said substrate holder to minimize the relative position error and the difference in relative velocity or acceleration between said gripper and said substrate holder, at the second position; and
  projecting said patterned beam of radiation onto a target portion of said substrate.

27. A device manufacturing method, comprising:
providing a substrate;
providing a beam of radiation using a radiation system;
imparting a desired pattern onto said beam of radiation by a patterning device, said patterning device being supported by a support structure;
transferring said patterning device via a gripping device, said transferring including:
  gripping with said gripping device at least one of (a) said patterning device at a first position and releasing said patterning device at a second position proximate to the support structure and (b) releasing said patterning device at a first position after gripping said patterning device at a second position proximate to the support structure,
  measuring a relative position of said gripping device with respect to said support structure in at least one direction using a measurement device separate and displaced from said gripping device,
  determining a relative position error with respect to a desired relative position based on the measured relative position, and
  adjusting relative position of said gripping device with respect to said support structure to minimize the relative position error and the difference in
  relative velocity or acceleration between said gripper and said support structure, at the second position; and
projecting said patterned beam of radiation onto a target portion of said substrate.

* * * * *